(12) United States Patent
Modtland et al.

(10) Patent No.: US 10,988,842 B2
(45) Date of Patent: Apr. 27, 2021

(54) CHEMICAL VAPOR TRANSPORT GROWTH OF TWO-DIMENSIONAL TRANSITION-METAL DICHALCOGENIDES

(71) Applicant: Massachusetts Institute of Technology, Cambridge, MA (US)

(72) Inventors: Brian J. Modtland, South Weymouth, MA (US); Jing Kong, Winchester, MA (US); Marc A. Baldo, Cambridge, MA (US); Efren Navarro-Moratalla, Valencia (ES); Xiang Ji, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 302 days.

(21) Appl. No.: 16/088,046

(22) PCT Filed: Apr. 17, 2018

(86) PCT No.: PCT/US2018/027852
§ 371 (c)(1),
(2) Date: Sep. 24, 2018

(87) PCT Pub. No.: WO2018/195004
PCT Pub. Date: Oct. 25, 2018

(65) Prior Publication Data
US 2019/0330735 A1     Oct. 31, 2019

Related U.S. Application Data

(60) Provisional application No. 62/486,173, filed on Apr. 17, 2017.

(51) Int. Cl.
*C23C 16/30* (2006.01)

(52) U.S. Cl.
CPC .................................. *C23C 16/305* (2013.01)

(58) Field of Classification Search
CPC ....... C23C 16/305; C30B 29/60; C30B 29/48; C30B 25/10
(Continued)

(56) References Cited

U.S. PATENT DOCUMENTS

| 10,062,568 B2* | 8/2018 | Pickett | C01B 19/002 |
| 2012/0021556 A1* | 1/2012 | Beck | C23C 14/243 |
| | | | 438/84 |

OTHER PUBLICATIONS

Hu ("Two-Dimensional Semiconductors Grown by Chemical Vapor Transport", Hu et al, Angew. Chem. Int. Ed. 2017, 56, 1-6) (Year: 2017).*

(Continued)

*Primary Examiner* — Michael P Wieczorek
*Assistant Examiner* — Michael G Miller
(74) *Attorney, Agent, or Firm* — Modern Times Legal; Robert J. Sayre

(57) ABSTRACT

A two-dimensional transition-metal dichalcogenide layer is grown by reacting a non- or low-volatile source material with a volatilized halogen or halide compound to produce a volatilized composition comprising at least one reaction product. The volatilized composition is flowed through an open chamber of a tube furnace with a temperature gradient, wherein the temperature changes along a path through which the volatilized composition flows through the open chamber of the tube furnace. Where the temperature along the path in the open chamber is in a reaction-temperature range, the volatilized composition is deposited as a two-dimensional crystalline transition-metal dichalcogenide layer.

17 Claims, 6 Drawing Sheets

(58) Field of Classification Search
USPC .......................................... 427/248.1–255.7
See application file for complete search history.

(56) References Cited

OTHER PUBLICATIONS

Wang ("Controlled Synthesis of Two-Dimensional 1T-TiSe2 with Charge Density Wave Transition by Chemical Vapor Transport", Wang et al, J. Am. Chem. Soc. 2016, 138, 16216-16219) (Year: 2016).*

Ubaldini ("Improved chemical vapor transport growth of transition metal dichalcogenides", Ubaldini et al, ICCGE-17, Warsaw 2013) (Year: 2013).*

Li ("Halide-assisted atmospheric pressure growth of large WSe2 and WS2 monolayer crystals", Li et al, Applied Materials Today 1 (2015) 60-66) (Year: 2015).*

J. Wang, et al., "Controlled Synthesis of Two-Dimensional 1T-TiSe2 with Charge Density Wave Transition by Chemical Vapor Transport," 13 J. Am Chem. Soc. 16216-19 (2016).

D. Hu, et al., "Two-Dimensional Semiconductors Grown by Chemical Vapor Transport", 129 Angew. Chem. 3665-69 (2017).

A. Ubaldini, et al., "Improved chemical vapor transport growth of transition metal dichalcogenides," ICCGE-17, Warsaw (2013).

* cited by examiner

CHEMICAL VAPOR TRANSPORT GROWTH OF TWO-DIMENSIONAL TRANSITION-METAL DICHALCOGENIDES

GOVERNMENT SUPPORT

This invention was made with government support under Grant No. DE-SC0001088 awarded by the Department of Energy and under Grant No. EFMA1542863 awarded by the National Science Foundation. The US Government has certain rights in the invention.

BACKGROUND

Transition metal dichalcogenides (TMDs) are a family of layered materials that show unique properties (different from their bulk counterparts) when thinned down to nanoscale thicknesses. Amongst the TMDs are stable semiconductors (e.g., the 2H phase of $MoS_2$, $WS_2$, and $WSe_2$) that have attracted a lot of attention due to their potential for future electronic, optoelectronic, and valleytronic applications. Other TMDs with stable metallic and semi-metallic phases (e.g., the 1T or 2H phase of $TaS_2$, $1T-TiSe2$, $2H-NbSe_2$, and $Td-WTe_2$) are attractive for investigations of charge density waves (CDW), superconductivity, magnetoresistance, and other topological phases of mater.

Production of TMD monolayers is usually accomplished through top-down micromechanical exfoliation of bulk crystals, as was first explored in graphene. To facilitate increased research throughput and large-scale device fabrication, bottom-up methods of synthesizing high-quality monolayer crystals are required. To date, a few techniques have been explored for growing the more stable disulfides, $MoS_2$ and $WS_2$. Chemical vapor deposition (CVD) is the most popular, specifically using elemental sulfur and metal oxides (i.e., $MoO_x$ or $WO_x$) as precursors. The use of other precursors have also been reported, including metal chlorides (e.g., $MoCl_5$ and $WCl_6$) or carbonyls [e.g., $Mo(CO)_6$ or $W(CO)_6$] with hydrogen sulfide gas ($H_2S$). Although successful, these methods become challenging for TMDs that are less stable due to rapid oxidation (e.g., $NbSe_2$). For these TMDs, it would be advantageous to employ a method that avoids oxygen-containing precursors while growing in an oxygen-free environment.

One commonly reported alternative to CVD is physical vapor deposition (PVD). PVD is simpler than CVD, as PVD uses the bulk form of the desired material (e.g., $WS_2$ powder) as the only precursor. By heating the material under vacuum, a vapor is produced; and the desired mono- to few-layers can be deposited on a cooler substrate. PVD has been used to successfully grow some monolayer TMD crystals, but a variety of limitations exist. For example, it is challenging to grow TMDs that lack a sufficient vapor pressure for transport at high growth temperatures under vacuum.

Therefore, it would be highly advantageous to develop a method combining the benefits of CVD and PVD, namely using the bulk product as a single precursor, while including a chemical process to sidestep the lack of vapor pressure. In fact, for bulk crystal growth, chemical vapor transport (CVT) is widely-used for just this purpose. By adding a reactive and volatile transport agent, often a halogen gas ($Cl_2$, $Br_2$, or $I_2$) or a halide compound, the non-volatile compound can chemically produce products in the gas phase that undergo vapor transport. A temperature gradient is typically established between the source zone and the growth zone in a sealed ampule using values from thermodynamic calculations. As a result, bulk crystals are slowly grown in the zone where formation is favored.

Although CVT is ubiquitously used to synthesize bulk crystals, it was only recently reported that atomically thin TMDs, including $WS_2$, can be grown using CVT in a sealed ampule by carefully controlling mass transport [J. Wang, et al., "Controlled Synthesis of Two-Dimensional $1T-TiSe_2$ with Charge Density Wave Transition by Chemical Vapor Transport," 13J. Am Chem. Soc. 16216-19 (2016), and D. Hu, et al., "Two-Dimensional Semiconductors Grown by Chemical Vapor Transport", 129 Angew. Chem. 3665-69 (2017)]. While using $I_2$ and metal chlorides as transport agents, the presented closed-tube technique still requires metal oxides and sulfur as precursors, akin to CVD, where stoichiometry is always a consideration.

SUMMARY

Methods and apparatus for growing a two-dimensional transition-metal dichalcogenide layer are described herein, where various embodiments of the methods and apparatus may include some or all of the elements, features and steps described below.

The methods can include reacting a non- or low-volatile source material with a volatilized halogen or halide compound to produce a volatilized composition comprising at least one reaction product. The volatilized composition flows through an open-chamber tube furnace in a temperature gradient, wherein the temperature changes along the path in the tube furnace through which the volatilized composition flows. Where the temperature is in a reaction temperature range, the volatilized composition is deposited as a two-dimensional [i.e., monolayer or few-layer (e.g., 2-5 layer)] crystalline transition-metal dichalcogenide layer.

A vacuum pump can be provided at one end of the open chamber; the vacuum pump reduces contamination and controls pressure in the tube furnace and also draws the flow of the volatilized composition through the tube furnace. The vapor pressure can be maintained in a range from 50 mTorr to 20 Torr in the tube furnace.

The halogen or halide compound can be volatilized from a solid salt in the tube furnace. The halogen can be selected from chlorine, bromine, and iodine. In particular embodiments, chlorine is volatilized from sodium chloride.

The deposited two-dimensional crystalline transition-metal dichalcogenide can have the formula $MX_2$, wherein M is a transition metal selected from Ti, Zr, Hf, V, Ta, Nb, Cr, Mo, W, Tc, Re, Pt, and Pd, and wherein X is a chalcogen selected from S, Se, and Te.

The non- or low-volatile source material can have essentially the same chemical composition as the deposited two-dimensional crystalline transition-metal dichalcogenide. In particular embodiments, the reaction of the transition-metal dichalcogenide with the volatized halogen or halide compound (to form the vaporized composition) replaces the chalcogen of the transition-metal dichalcogenide with the halogen. Moreover, the chalcogen can replace the halogen when the crystalline two-dimensional transition-metal dichalcogenide layer is deposited.

The volatilized composition can be entrained in a flowing gas mixture comprising argon and hydrogen through the tube furnace. In particular embodiments, where $WS_s$ is deposited, the flow rate of the volatilized composition and gas mixture can be in a range from 100 sccm to 150 sccm.

In particular embodiments, the temperature decreases along the flow path of the volatilized products, and the volatilized composition reacts where the temperature drops below a reaction temperature. Where the volatilized composition comprises at least two reaction products, the reaction products can react with each other to produce the deposited two-dimensional crystalline transition-metal dichalcogenide layer.

Figure 1:
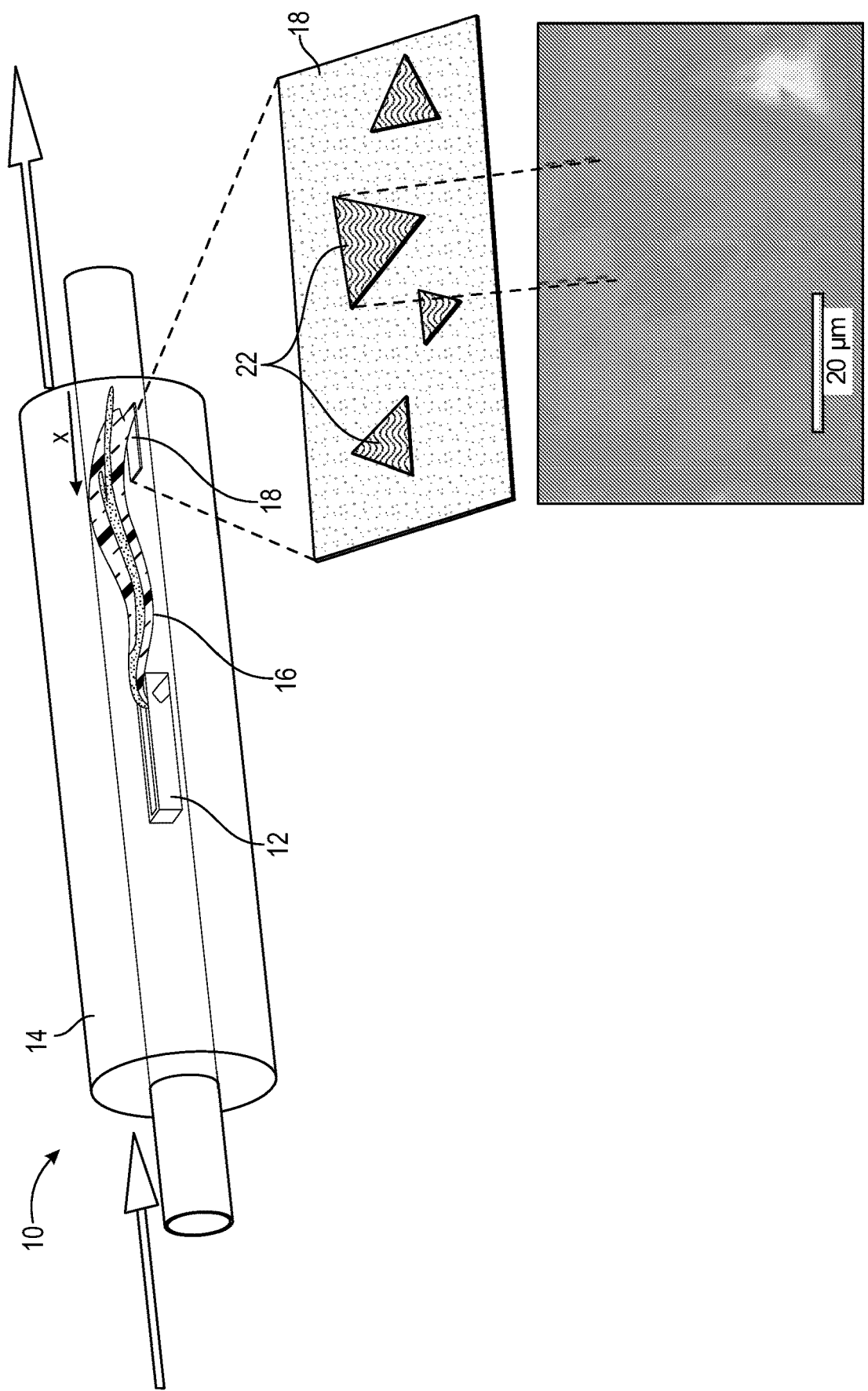
FIG. 1 illustrates chemical-vapor-transport (CVT) growth of $WS_2$ with an open-tube design via a schematic drawing of an open-tube chemical vapor transport growth system 10, wherein a crucible 12 at the center of a single-zone tube furnace 14 contains $WS_2$ powder mixed with NaCl that is heated to 950° C., forming tungsten chloride(s) and sulfur gases 16. The reverse reaction occurs downstream, resulting in deposition of monolayer $WS_2$ on a substrate 18.

In the accompanying drawings, like reference characters refer to the same or similar parts throughout the different views. The drawings are not necessarily to scale; instead, an emphasis is placed upon illustrating particular principles in the exemplifications discussed below. For any drawings that include text (words, reference characters, and/or numbers), alternative versions of the drawings without the text are to be understood as being part of this disclosure; and formal replacement drawings without such text may be substituted therefor.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise herein defined, used or characterized, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially (though not perfectly) pure, as practical and imperfect realities may apply; e.g., the potential presence of at least trace impurities (e.g., at less than 1%) can be understood as being within the scope of the description. Likewise, if a particular shape is referenced, the shape is intended to include imperfect variations from ideal shapes, e.g., due to manufacturing tolerances. Percentages or concentrations expressed herein can be in terms of weight or volume.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

In methods described below, chemical vapor transport (CVT) is employed in an open chamber under vacuum to produce mono- and few-layer transition metal dichalcogenides (TMDs). In addition, we improve on previous work by using bulk TMDs as their own oxygen-free precursors, simplifying the process by guaranteeing stoichiometry.

WS$_2$ was selected for this investigation. To start, WS$_2$ growth has been previously reported using both CVD and PVD methods, so those results can serve as a comparison. Second, PVD growth of WS$_2$ bears the challenges mentioned above—i.e., WS$_2$ lacks a sufficient vapor pressure even at 1000° C. under vacuum and actually dissociates at 1250° C. rather than evaporating. Furthermore, monolayer WS$_2$, itself, is a material of great interest; in particular, monolayer WS$_2$ is a semiconducting TMD that transitions from an indirect to a direct band gap in the monolayer limit, exhibiting efficient light emission and absorption mediated by tightly-bound excitons. With improved light emission and absorption compared to other 2D semiconductors, monolayer WS$_2$ has been a target of interest for atomically thin optoelectronic devices, such as LEDs, lasers, and photodetectors. Finally, monolayer WS$_2$ exhibits valley pseudospin, a property of interest in condensed matter physics with applications in novel valleytronic devices for next-generation logic and quantum information.

An experimental setup of an open-tube chemical-vapor transport growth system 10 is illustrated in FIG. 1, including a crucible 12 for non-volatile or low-volatile source material, a tube furnace 14 including an open tube 20, and a substrate 18 for deposition of the 2-D crystalline TMD layer 22 from the volatilized composition 16. In order to limit growth to a single layer or few layers, an open-tube design is used, in contrast to the use of a closed ampule for bulk crystal growth. For bulk crystals, a closed system allows recycling of the transport agent, producing large crystals. By using an open design with a limited dose of a halide transport agent, we have found that the reaction can be slowed to produce crystals down to a single layer. Crystal growth was also performed at low process pressure (100 mTorr-10 Torr) under regulated gas flow, which adds a level of control to crystal nucleation and growth.

Figure 2:
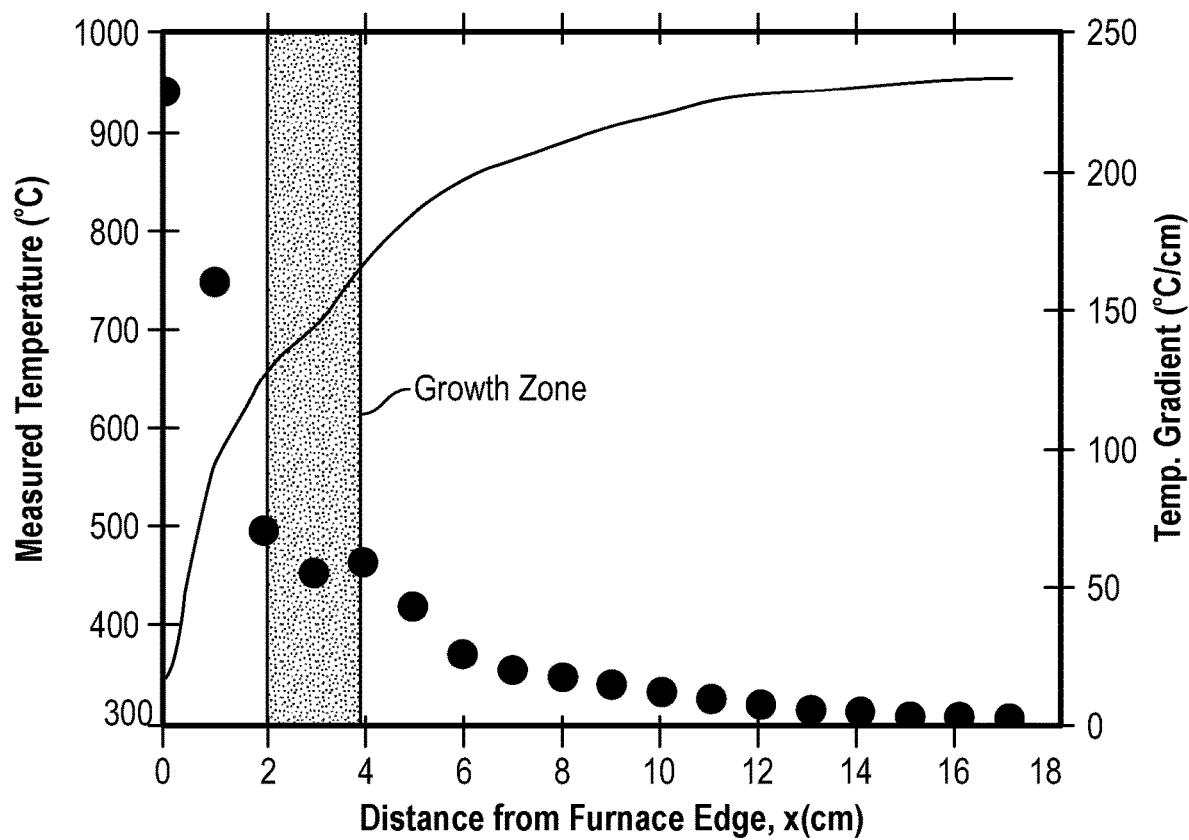
FIG. 2 plots the measured temperature (via the line plot) and temperature gradient (via discrete circular plots) as a function of distance from the furnace's edge in the stem of FIG. 1, indicating where optimal growth occurs.

The measured temperature profile and temperature gradient of the employed single-zone tube furnace is plotted in FIG. 2. During a typical growth run, a carrier gas of argon with 5% hydrogen flows at 150 sccm through the tube furnace 14 while the temperature of the furnace 14 is increased to 950° C. at ~30° C. min$^{-1}$. At the center of the furnace 14 sits a quartz crucible 12 containing WS$_2$ powder mixed with sodium chloride (NaCl) in this embodiment. Downstream, a SiO$_2$/Si (300 nm oxide) growth substrate 18 is located in the optimum location for crystal deposition, where the temperature is approximately 700° C.-750° C. when the set point is reached. At the same time, the temperature at the edge of the furnace 14 (i.e., 18 cm from the center in this embodiment) is roughly 300° C. The temperature gradient, especially at locations close to the edge of the furnace 14, is quite large with values >50° C. cm$^{-1}$. It is worth noting that achieving large monolayer flakes 22 by PVD is challenging in the presence of such large gradients. Thus, PVD synthesis is advantageously performed in furnaces with three heating zones.

In order to obtain monolayer deposition on the growth substrate, a suitable transporting agent is chosen. Based on thermodynamic calculations, chlorine was predicted to be a suitable transport agent for WS$_2$. To function effectively as a transport agent, the free Gibbs energy of the reaction (e.g., chlorine reacting with WS$_2$ to produce WCl$_4$ and sulfur), either product-favored or reactant-favored, should be close to zero and flip signs in a temperature gradient that is practical for the system design. This is equivalent to saying the reaction's equilibrium constant, $K_{eq}$, switches from being greater than 1 (product-favored) to less than 1 (reactant-favored) on either side of an optimal temperature, $T_{opt}$.

$$\Delta G_r^0 = \Delta H_r^0 - T\Delta S_r^0$$

$$\Delta G_r^0 = 0, \; T_{opt} = \frac{\Delta H_r^0}{\Delta S_r^0}$$

The proposed reaction, below, includes the formation of volatile tungsten chlorides (of various oxidation states) and diatomic sulfur gas as products at temperatures above 700° C., with slight variation depending on the assumed oxidation state of tungsten (x=1-6).

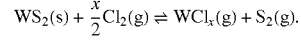

$$WS_2(s) + \frac{x}{2}Cl_2(g) \rightleftharpoons WCl_x(g) + S_2(g).$$

The use of sodium chloride (NaCl) as the source for chlorine was found to work extremely well in this system. In addition to NaCl, other alkali halide salts were tested. Potassium chloride (KCl), potassium iodide (KI), and sodium iodide (NaI) all show successful CVT growth of lesser quality, but conditions were not optimized in those tests—the conditions used for all salts were the same as the best NaCl runs, namely a 950° C. center temperature in the tube furnace and a 4:1 WS$_2$ to salt ratio, with a process pressure of ~3 Torr. Knowing that each has a different melting point, temperature is one parameter that may be adjusted to improve growth with these salts. Different halogens may be better suited for different TMD's (e.g., iodine may be better suited for TaS$_x$). Regardless, the use of NaCl as a transfer agent is advantageous, as it is non-hazardous and easy to control.

Figure 3:
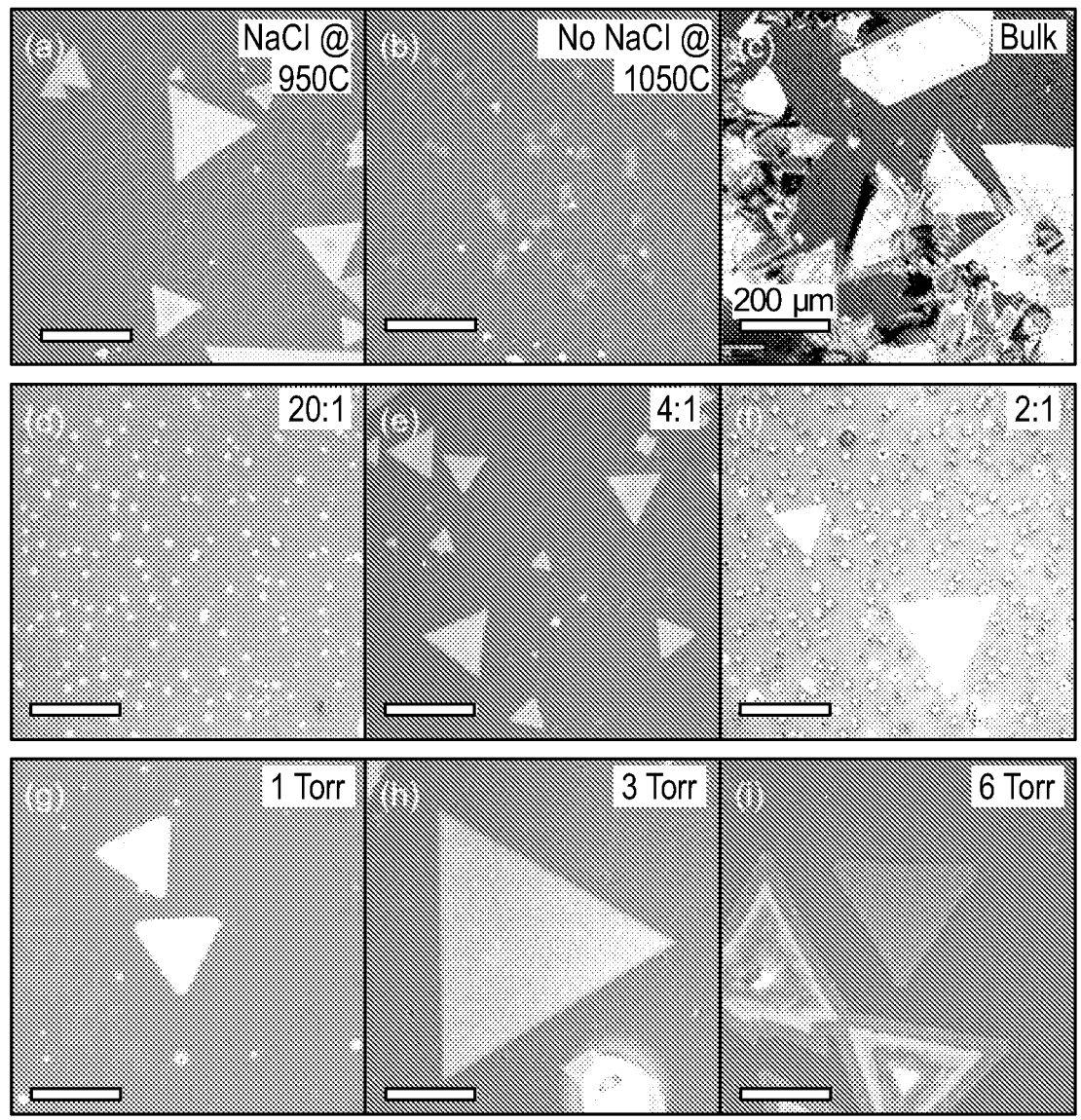
FIG. 3 presents optical micrographs of $WS_2$ growth. Image (a) shows growth using NaCl added to the $WS_2$ precursor crucible, as compared to image (b), which shows growth without NaCl, requiring a higher temperature and growth time to produce smaller crystals. Image (c) shows bulk crystal growth via conventional CVT in a sealed quartz ampule using $WS_2$ and NaCl as the transport agent. Images (d)-(f) offer a comparison of CVT growth with different $WS_2$:NaCl ratios. Images (g)-(i) offer a comparison of CVT growth with different process pressures, noting the uniform bilayers in image (g). Unless otherwise denoted in these images, growth occurred with the furnace temperature set to 950° C., with a process pressure of 3 Torr, and a $WS_2$:NaCl ratio of 4:1. All scale bars are 20 m unless denoted.

Images (a) and (b) of FIG. 3 compare the typical growth results with NaCl [image (a)] and without NaCl [image (b)] added to WS$_2$ powder. In the absence of NaCl, the growth process is the same as PVD, which we found to be unreliable for monolayer WS$_2$ growth. Presumably, the main challenges are the low vapor pressure of WS$_2$, indicated by the need for a 1,050° C. growth temperature, and the large temperature gradient in a single-zone furnace, as mentioned previously. When NaCl is mixed with WS$_2$ (20 wt % NaCl), the production of monolayer WS$_2$ becomes significantly more reproducible. To verify NaCl as a transport agent, we grew bulk crystals via conventional CVT by placing lg of WS$_2$ powder and 200 mg of NaCl in an evacuated, sealed quartz ampule. The ampule was placed in a three-zone furnace with a temperature gradient from 800° C. to 730° C. Total growth time was 15 days. Image (c) of FIG. 3 shows the resulting crystals from the low-temperature region with similar morphology to our atomically thin samples, indicating the same mechanism. Additional experiments produced results that agree with this conclusion.

Of the various parameters, the amount of NaCl mixed with WS$_2$ is important for creating monolayers, acting as the limiting factor for crystal growth. Once the salt is consumed, growth halts. In addition, the relative ratio of WS$_2$ to NaCl greatly affects growth quality. For this setup, we found the best ratio of WS$_2$ to NaCl was 4:1 by weight [see image (e) of FIG. 3], though the ratio may vary depending on the dimensions of the tube furnace and the crucible size. Adding excess salt resulted in broken WS$_2$ crystals and undesired particles [see image (f) of FIG. 3]. Too little salt resulted in smaller or nonexistent crystals [see image (d) of FIG. 3]. Moreover, we discovered that the process pressure range of 3-5 Torr worked well for producing large monolayers [see image (h) of FIG. 3]. Higher pressures result in a larger occurrence of pyramidal growth with monolayer edges [see image (g) of FIG. 3]. Lower pressures resulted in few monolayers; instead, the usual result was uniform bilayers and trilayers [see image (i) of FIG. 3]. These structures have been difficult to achieve by CVD, thereby offering an added benefit of this method. Using optimized parameters, we are able to achieve some triangular monolayer flakes with edges over 50 µm in length [see image (h) of FIG. 3], while typical flakes have edges that are 10-30 µm long.

Besides sodium chloride, other transporting agents were investigated as well. Chlorine gas (100 ppm in argon) was attempted directly; but only thick crystals were obtained, seemingly because even that amount of $Cl_2$ was still too high compared to the residual amount generated from NaCl at high temperatures. Iodine ($I_2$), on the other hand, was found to be too difficult to control due to its low sublimation temperature, and no significant deposition occurred. Interestingly, NaCl and other alkali halide salts were previously shown to chemically assist with the growth of $WS_2$ and $WSe_2$ monolayers; but, in that study [S. Li, et al., "Halide-assisted atmospheric pressure growth of large $WSe_2$ and $WS_2$ monolayer crystals", 1 Appl. Mater. Today 60-66 (2015)], tungsten oxide and sulfur were still used as precursors, with the limitations previously discussed.

Figure 4:
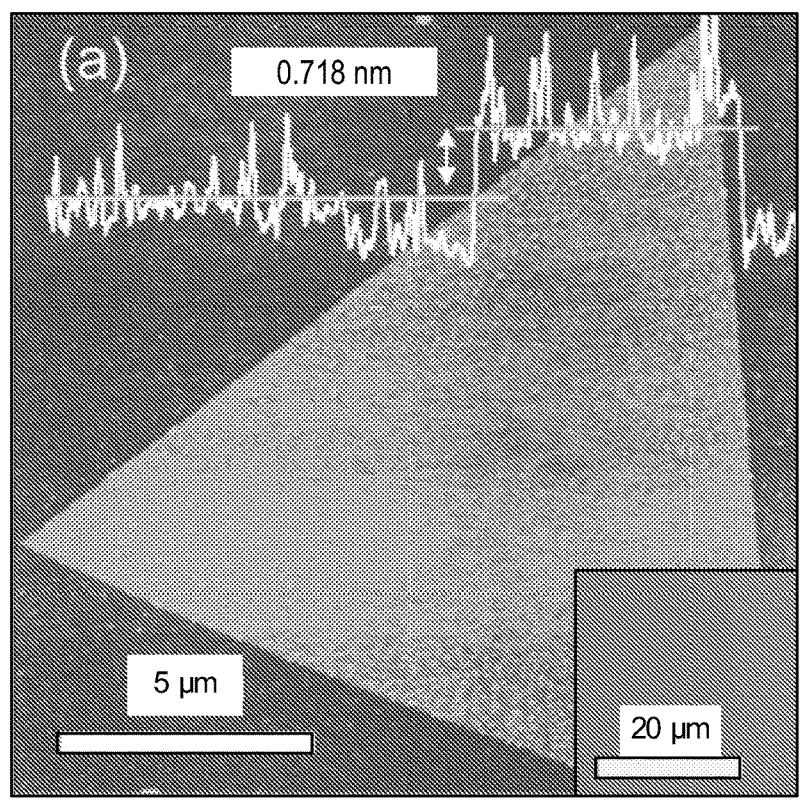
FIG. 4 is an atomic-force micrograph and line profile of a monolayer $WS_2$ sample grown by CVT (inset).
Figure 5:
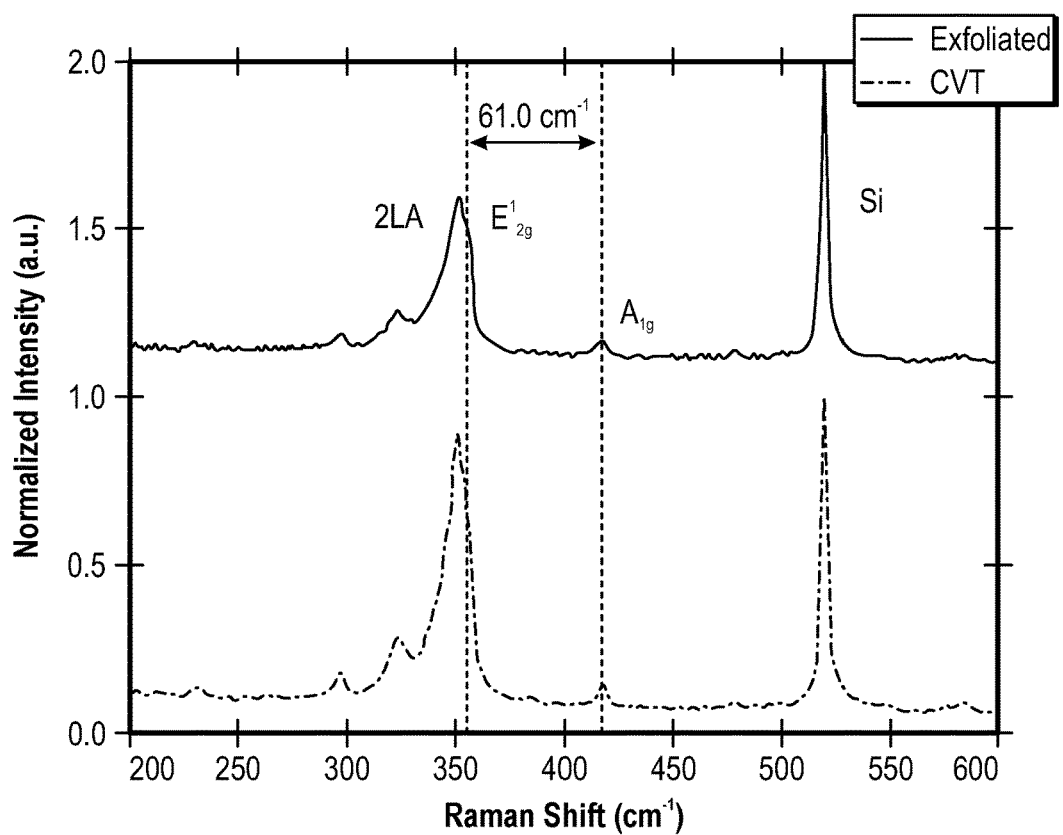
FIG. 5 is a Raman-spectrum plot for exfoliated (top) and CVT (bottom) monolayers, showing separation between the $E_{2g}$ and $A_{1g}$ peaks of 61.0 cm$^{-1}$.

Layer thickness was initially identified for the CVT-grown samples by optical contrast in an optical microscope. To confirm, atomic force microscopy (AFM) in tapping mode was used. The atomic force microscopy (AFM) image in FIG. 4 (for the flake in the inset) matches monolayer thickness with a step height between 0.7-0.8 nm. The image displays good height uniformity matching the underlying substrate (RMS roughness=0.31 nm) with no visible nanoscale defects. Raman spectroscopy with a 532 nm laser on the same sample shows a peak separation of 61.0 $cm^{-1}$ between the in-plane ($E^1_{2g}$) and the out-of-plane modes ($A_{1g}$), as shown in FIG. 5. Comparing these results to those of a sample produced by mechanical exfoliation from a crystal grown by vapor transport, the peak wavenumbers are the same, and the peak ratios are similar, confirming monolayer thickness and indicating comparable crystal quality.

Figure 6:
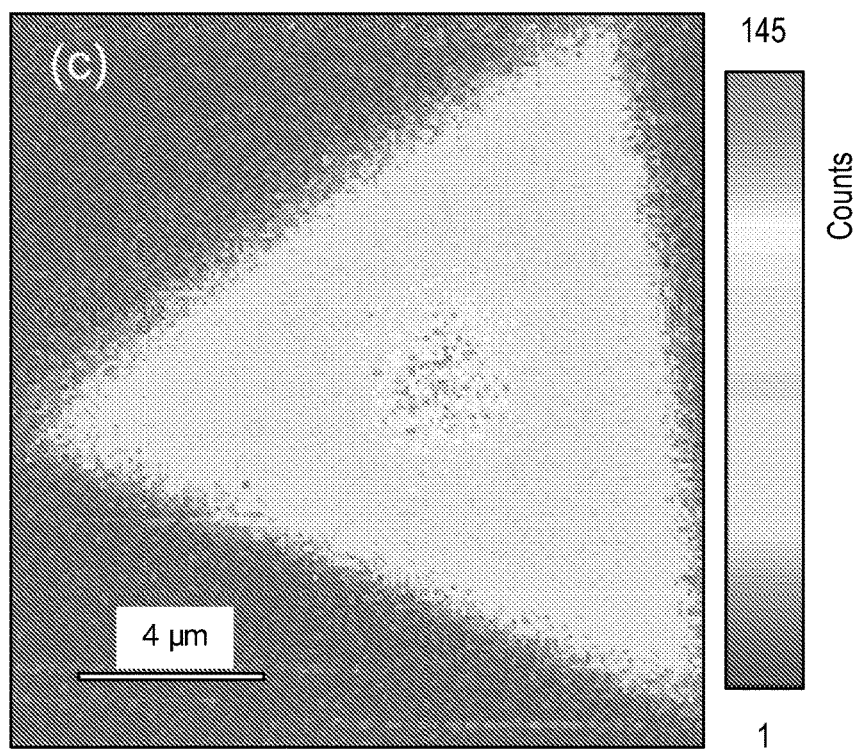
FIG. 6 is a photoluminescence (PL) intensity map of the same sample shown in FIG. 4.

To test uniformity of luminescence over the entire monolayer, a spatially dependent photoluminescence (PL) measurement was obtained by scanning with a piezo stage every 10 nm (with a spot size of ~1 µm). In FIG. 6, a PL map of the previous monolayer sample is presented. Photoluminescence varies smoothly across the flake, with roughly three times higher intensity in the center relative to the edges. We note that this trend differs from results observed by others where edges often emit at the brightest levels.

Figure 7:
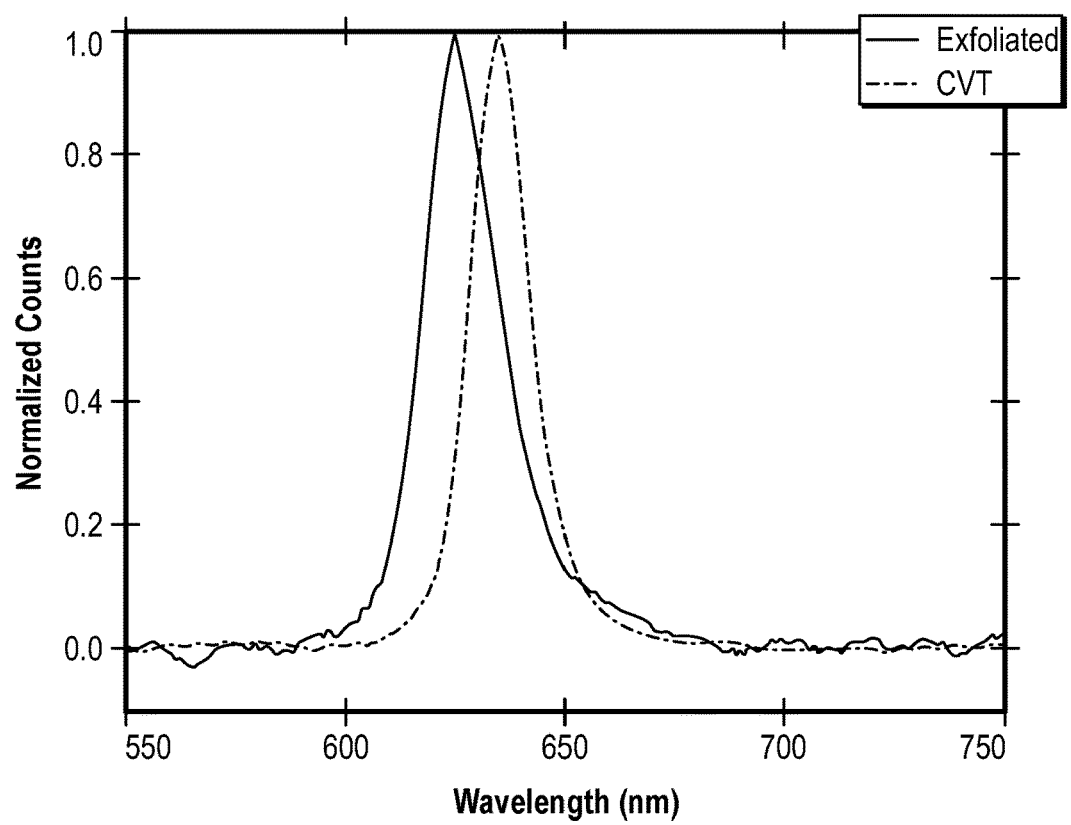
FIG. 7 plots the normalized PL spectra for exfoliated (left peak) and CVT (right peak) flakes, showing a 10-nm peak shift.

Photoluminescence from the CVT-grown flakes was bright. Following the work of Splendiani, et al., in "Emerging Photoluminescence on $MoS_2$," 10 Nano Lett. 1271-75 (2010)], the ratio of PL emission to the $A_{1g}$ Raman peak is calculated as a proxy for PL quantum efficiency. Previous reports give values from 20 to as high as 880 for $WS_2$ monolayers using 488 nm excitation. A peak ratio around 550 was measured for the displayed monolayer in FIG. 4 using 532 nm excitation at 1 W power. Due to potential complications, such as intensity-dependent nonlinearities in PLQY and Raman modes that vary with excitation wavelength, we feel this ratio should be interpreted cautiously as an estimate of sample quality, rather than for quantified comparison. While bright, the peak wavelength of 635 nm is red-shifted by 10 nm compared to the exfoliated sample (see FIG. 7) but is still within the range observed by others for samples produced via CVD and PVD. We hypothesize that this is a result of crystal strain during growth due to the difference in thermal expansion between the oxide substrate and $WS_2$ material, mostly during the cool-down phase. This phenomenon has been explored with CVD samples showing that transfer relieves the strain and blue-shifts the PL peak. Using a poly(methyl methacrylate) (PMMA)-mediated technique with hydrofluoric acid to etch the $SiO_2$, we transfer as-grown flakes to a similar donor substrate. We note a blueshift in PL emission that closely matches the exfoliated sample. In addition, the peak for monolayers exfoliated from the salt-assisted thick crystals [image (c) of FIG. 3] was 625 nm, matching closely with reference flakes exfoliated from bulk crystals synthesized with iodine. Finally, the linewidth of PL emission is narrow, with a full width at half maximum (FWHM) of 48 meV, which compares to a FWHM of 61 meV for the exfoliated flake, indicating less inhomogeneous broadening from crystal defects.

Figure 8:
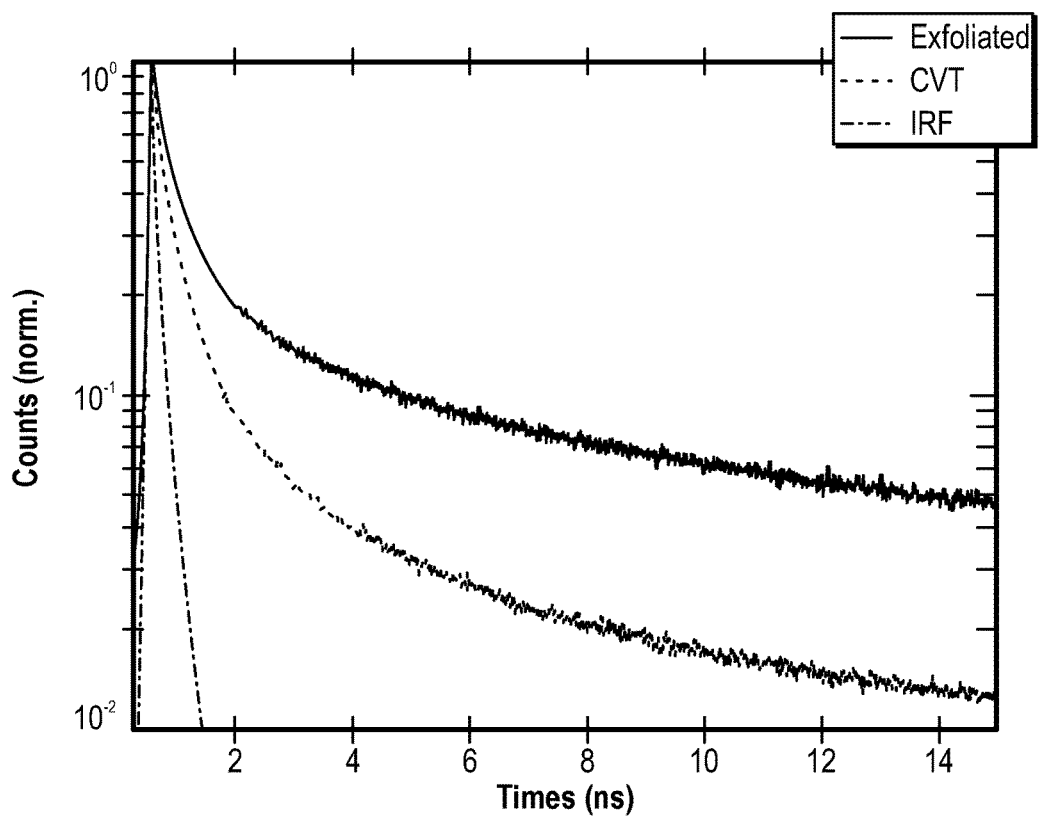
FIG. 8 plots a time-dependent photoluminescence comparison between CVT (middle) and exfoliated (top) monolayer samples at low-intensity excitation.

To characterize the exciton dynamics of flakes grown by CVT, we measure the time-dependent photoluminescence of the CVT-grown sample (middle curve) compared to the same exfoliated sample (top curve) in FIG. 8. The third and final curve (bottom curve) gives the instrument response function (IRF), indicating the delta response of the entire system that limits temporal resolution. All data is taken using a time-correlated single photon counting (TCSPC) setup with a pulsed 405 nm laser and a single-photon avalanche detector. The laser fluence of ~80 nJ $cm^{-2}$ was the lowest level where the average photon count rate was still one order of magnitude above the dark count rate (~50 cps).

Figure 9:
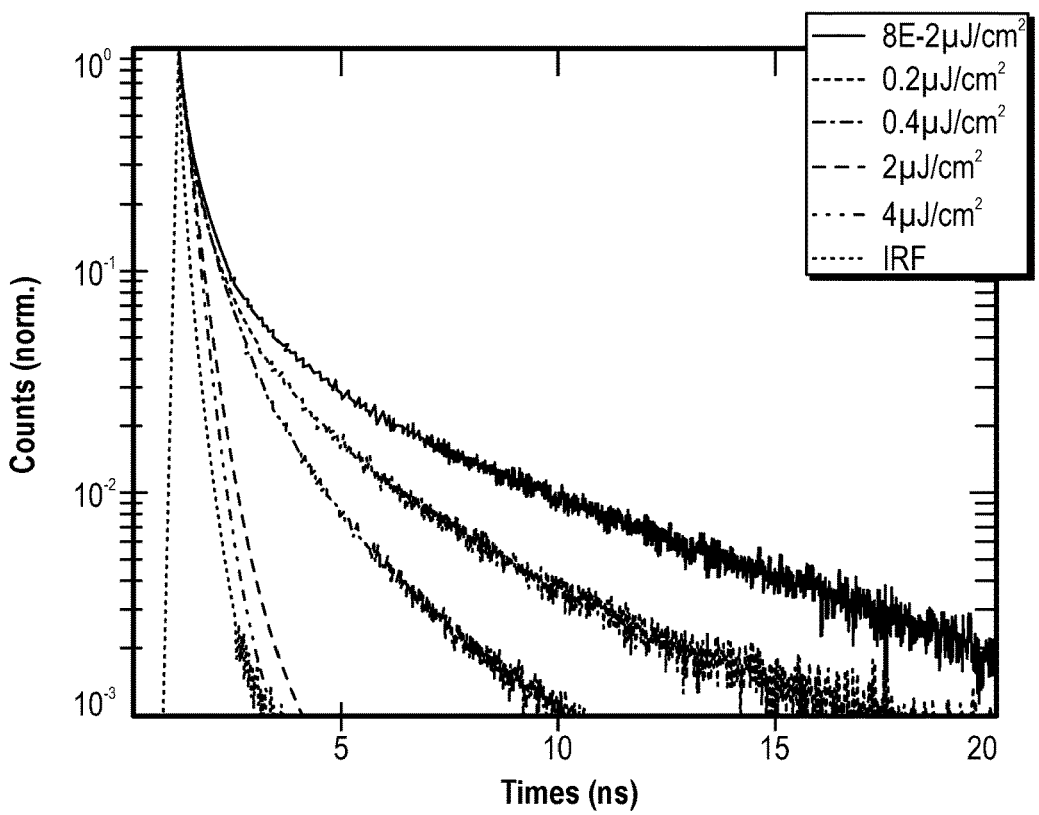
FIG. 9 plots the power-dependent PL transient for a CVT sample, indicating strong nonlinear exciton dynamics in $WS_2$ due to multi-particle annihilation, such as exciton-exciton or exciton-charge interactions.

The PL transient of the CVT sample is observed to be faster than the corresponding response of the exfoliated flake, which suggests that the CVT-grown material may possess more non-radiative losses. Interestingly, as shown in FIG. 9, the CVT sample is almost entirely dominated by a quadratic intensity dependence, consistent with recombination by multi-particle annihilation, such as exciton-exciton or exciton-charge interactions.

To summarize, a CVT method of growing monolayer (or few-layer) TMDs uses a salt, such as NaCl, as a transport agent in an open-tube system. This technique improves on the techniques of PVD and CVD, advantageously using a bulk form of the desired product as a precursor while using chemistry to avoid the low vapor pressures observed by TMDs at elevated temperatures. The method was demonstrated in the growth of monolayer crystals of $WS_2$ that are over 50 m per edge with a high degree of uniformity. Triangular domains exhibit bright luminescence and narrow linewidths compared to exfoliated flakes from a high-quality bulk crystal. Finally, photoluminescence transient measurements reveal strong multi-particle interactions, similar to exfoliated samples. Consequently, halide-assisted CVT is seen to be a straightforward method for producing high-quality $WS_2$ monolayer crystals, with broader application to the growth of other TMDs, which have proven challenging, or even impossible, by earlier methods.

Experimental Section
  Growth:
    At the center of a one-inch tube furnace (Thermo Scientific Lindberg/Blue M Mini-Mite), 99.99% pure $WS_2$ powder (Alfa-Aesar) was mixed with NaCl salt (Sigma-Aldrich) and placed in a fused-silica crucible (MTI Corp.) inside a quartz tube. Empirically, adding only 20-weight % NaCl to 10 mg of $WS_2$ resulted in the best growth. Downstream from the crucible, a one-inch×½-inch $SiO_2$/Si substrate (300 nm oxide) was placed face up. Before growth, the entire tube was pumped to low vacuum (~1 mTorr), followed by an extensive process to remove oxygen and moisture from the tube. Since oxidation of $WS_2$ readily occurs at high-temperatures, high-quality growth requires the removal of oxygen and water from the system, both during and between runs. As the entire process occurs under vacuum, equilibrium is reached between the injected and exhausted gases. Using 150 sccm $Ar/H_2$ flow, the process pressure was approximately 1 Torr. To give another degree of freedom to the system, a butterfly valve can dynamically control pressure independently of gas flow. Process pressures during typical growth runs was manually adjusted between 3-5 Torr. Growth occurred at a set point temperature of 950° C. for 20 minutes, at which point, the furnace cooled naturally to 600° C. Finally, the lid was opened, and the furnace cooled further until reaching ~200° C. when the substrate and crucible were cool enough to handle.

Raman Spectroscopy:

Raman data was acquired using a Horiba LabRAM HR800 system with a 532-nm CW laser. An 1800 gr $mm^{-1}$ grating was used with a 100× objective (NA=0.9). PL emission to $A_{1g}$ Raman mode ratios were calculated using data from the same setup by scanning from 200 $cm^{-1}$ to 5000 $cm^{-1}$.

Transient PL Measurements:

Time-dependent photoluminescence was acquired using the time-correlated single-photon counting (TCSPC) technique with a Picoharp 300 (Picoquant GmbH) in T3 time-tagged mode. An inverted microscope (Nikon Eclipse Ti) with a PLANFLURO 40× (NA=0.95) objective was used as the platform for measurements, having a spot size of ~1 μm. Photon detection was performed using a single photon avalanche diode (SPAD) with a response time of 50 ps (Micro Photon Devices PDM Series). The excitation source was a 405-nm pulsed laser (Picoquant LDH-P-C-405) with a 100-ps pulse width, operating at a repetition rate of 40 MHz. Average excitation power was initially set to 10 W, low enough to avoid photo degradation and after-pulsing from the laser. Using a reflective neutral-density (ND) filter wheel, intensity was further reduced until the detection rate was around 500 cps, sufficiently above the dark counts of ~50 cps.

The instrument response function (IRF) is the combined delta response of the optical and electronic components, coming mostly from the convolution of the laser pulse and SPAD response. The IRF of this system was measured by using a fast (picosecond) emitter in solution, namely Allura Red (AR) dye ($C_{18}H_{14}N_2Na_2O_8S_2$) in de-ionized (DI) water (0.5 mM concentration). On a coverslip, a droplet of solution acts as the sample. With the same 10 W full power (to avoid power-dependent pulse shape changes), the differential detection rate was made to be almost the same as the $WS_2$ samples using neutral-density (ND) filters. Allura Red was used rather than detection of the scattered laser due to the wavelength-dependent timing response of the SPAD, since $WS_2$ emits around 625 nm, and the laser emits at 405 nm. As the PL lifetime is similar in magnitude to the IRF pulse width, any errors associated with the color shift are limited.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step. Likewise, a single element or step may be replaced with a plurality of elements or steps that serve the same purpose. Further, where parameters for various properties or other values are specified herein for embodiments of the invention, those parameters or values can be adjusted up or down by $1/100^{th}$, $1/50^{th}$, $1/20^{th}$, $1/10^{th}$, $1/5^{th}$, $1/3$rd, $1/2$, $2/3$rd, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions, and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety for all purposes; and all appropriate combinations of embodiments, features, characterizations, and methods from these references and the present disclosure may be included in embodiments of this invention. Still further, the components and steps identified in the Background section are integral to this disclosure and can be used in conjunction with or substituted for components and steps described elsewhere in the disclosure within the scope of the invention. In method claims (or where methods are elsewhere recited), where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for growing a two-dimensional transition-metal dichalcogenide layer, comprising:
    reacting a non- or low-volatile source material comprising a transition-metal dichalcogenide with a volatilized halogen or halide compound to produce a volatilized composition comprising at least one reaction product;
    flowing the volatilized composition through an open chamber of an open-chamber tube furnace with a temperature gradient, wherein the temperature changes along a path through which the volatilized composition flows through the open chamber of the tube furnace; and
    where the temperature along the path in the open chamber is in a reaction-temperature range, depositing the volatilized composition as a two-dimensional crystalline layer of the transition-metal dichalcogenide.

2. The method of claim 1, further comprising providing a vacuum pump at one end of the open chamber, wherein the vacuum pump reduces contamination and controls pressure in the open chamber and draws the flow of the volatilized composition through the open chamber.

3. The method of claim 2, further comprising maintaining a vapor pressure in a range from 50 mTorr to 20 Torr in the open chamber.

4. The method of claim 1, further comprising vaporizing the halogen or halide compound from a solid salt in the tube furnace.

5. The method of claim 4, wherein the halogen is selected from chlorine, bromine, and iodine.

6. The method of claim 5, wherein the halogen is chlorine.

7. The method of claim 6, wherein the chlorine is volatilized from sodium chloride.

8. The method of claim 1, wherein the crystalline transition-metal dichalcogenide has the formula $MX_2$, wherein M is a transition metal selected from Ti, Zr, Hf, V, Ta, Nb, Cr, Mo, W, Tc, Re, Pt, and Pd, and wherein X is a chalcogen selected from S, Se, and Te.

9. The method of claim 8, wherein the crystalline transition-metal dichalcogenide is selected from $WS_2$ and $WSe_2$.

10. The method of claim 1, wherein the deposited two-dimensional crystalline transition-metal dichalcogenide layer is a monolayer.

11. The method of claim 1, wherein the reaction of the transition-metal dichalcogenide with the volatized halogen or halide compound replaces the chalcogen of the transition-metal dichalcogenide with the halogen.

12. The method of claim 11, wherein the chalcogen replaces the halogen when the crystalline two-dimensional transition-metal dichalcogenide layer is deposited.

13. The method of claim 1, wherein the chalcogen of the transition-metal dichalcogenide is selected from sulfur, selenium, and tellurium.

14. The method of claim 1, further comprising entraining the volatilized composition in a flowing gas mixture comprising argon and hydrogen through the open chamber of the tube furnace.

15. The method of claim 14, wherein $WS_s$, is deposited, and wherein the flow rate of the volatilized composition and gas mixture is in a range from 100 sccm to 150 sccm.

16. The method of claim 1, wherein the temperature decreases along the flow path of the volatilized composition, wherein the volatilized composition reacts where the temperature drops below a reaction temperature.

17. The method of claim 1, wherein the volatilized composition comprises at least two reaction products, and wherein the reaction products react with each other to produce the deposited two-dimensional crystalline transition-metal dichalcogenide layer.

* * * * *